United States Patent
Marsh et al.

(10) Patent No.: US 7,847,378 B2
(45) Date of Patent: Dec. 7, 2010

(54) COMPLIANT WIREBOND PEDESTAL

(75) Inventors: Jeffrey W. Marsh, Murphy, TX (US); R. Tracy White, Plano, TX (US); David L. Hamilton, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/543,358

(22) Filed: Aug. 18, 2009

(65) Prior Publication Data

US 2009/0309211 A1    Dec. 17, 2009

Related U.S. Application Data

(62) Division of application No. 11/745,662, filed on May 8, 2007, now Pat. No. 7,575,147, which is a division of application No. 11/096,410, filed on Apr. 1, 2005, now Pat. No. 7,214,607, which is a division of application No. 09/750,827, filed on Dec. 28, 2000, now Pat. No. 6,877,650.

(60) Provisional application No. 60/173,776, filed on Dec. 30, 1999, provisional application No. 60/160,521, filed on Nov. 18, 1999.

(51) Int. Cl.
  *H01L 23/495* (2006.01)
  *H01L 21/50* (2006.01)
  *H01L 21/44* (2006.01)
(52) U.S. Cl. .................. 257/676; 438/123; 438/615
(58) Field of Classification Search ............. 228/49.5, 228/4.5, 180.1–180.5; 438/123, 615; 257/676, 257/773
See application file for complete search history.

(56) References Cited

U.S. PATENT DOCUMENTS

| | | | |
|---|---|---|---|
| 4,143,868 A | 3/1979 | Bergman | |
| 5,324,012 A * | 6/1994 | Aoyama et al. | ............... 269/21 |
| 5,496,775 A | 3/1996 | Brooks | |
| 5,639,694 A | 6/1997 | Diffenderfer et al. | |
| 5,661,089 A | 8/1997 | Wilson | |
| 5,686,353 A | 11/1997 | Yagi et al. | |
| 6,039,831 A | 3/2000 | Mine et al. | |
| 6,048,254 A | 4/2000 | Duescher | |
| 6,085,962 A | 7/2000 | Jacobson et al. | |
| 6,169,330 B1 | 1/2001 | Pankove | |
| 6,877,650 B2 | 4/2005 | Marsh et al. | |
| 7,214,607 B2 * | 5/2007 | Marsh et al. | ................ 438/617 |
| 7,575,147 B2 * | 8/2009 | Marsh et al. | ............... 228/49.5 |

* cited by examiner

*Primary Examiner*—Calvin Lee
(74) *Attorney, Agent, or Firm*—Charles A. Brill; Wade James Brady, III; Frederick J. Telecky, Jr.

(57) ABSTRACT

A wire bonder (900) with a rigid pedestal (902) having resilient inserts (920). A package (904) placed on the pedestal (902) contains an electrical device (906). The bond pads on the electrical device (906) are electrically connected to bond pads on the package (904) by a series of bond wires (908) through use of a well know bonding process. A vacuum source holds the package (904) against the pedestal (902) deforming the resilient strips (920) located in the rigid member (902) of the pedestal and ensuring good contact between the ground pads of the package (904) and conductive resilient members (920). The resilient members (920) are conductive and electrically connect the package grounds to a system ground (922).

11 Claims, 2 Drawing Sheets

COMPLIANT WIREBOND PEDESTAL

This application is a Divisional of application Ser. No. 11/745,662, filed 8 May 2007 and now U.S. Pat. No. 7,575,147, application Ser. No. 11/096,410, filed 1 Apr. 2005 and now U.S. Pat. No. 7,214,607, application Ser. No. 09/750,827, filed 28 Dec. 2000 and now U.S. Pat. No. 6,877,650, Provisional Application No. 60/173,776, filed 30 Dec. 1999, and Provisional Application No. 60/166,521, filed 18 Nov. 1999.

FIELD OF THE INVENTION

This invention relates to the field of semiconductor manufacturing, particular to semiconductor packaging, more particularly to the process of attaching bond wires between a package and a semiconductor device that is sensitive to particles generated by the bond out process.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

A digital micromirror device (DMD™), sometimes referred to as a deformable micromirror device, is a type of micromechanical device. Other types of micromechanical devices include accelerometers, pressure and flow sensors, gears and motors. While some micromechanical devices, such as pressure sensors, flow sensors, and DMDs have found commercial success, other types have not yet been commercially viable.

Digital micromirror devices are primarily used in optical display systems. In display systems, the DMD is a light modulator that uses digital image data to modulate a beam of light by selectively reflecting portions of the beam of light to a display screen. While analog modes of operation are possible, DMDs typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics illuminated the membrane and created an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the DMD surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

Micromirror devices have proven very difficult to manufacture. Not only are the steps of forming the mirrors difficult to perform in a production environment, the completed device is extremely sensitive to debris generated by the production process. While most semiconductor devices can be washed to remove debris and contaminants, the surface tension of a liquid used to wash the micromirror device destroys the mirror array. Therefore, extreme caution must be used to avoid creating debris once the mirrors are fully formed and the sacrificial layers on which they were formed have been removed.

One process that causes failures is the package bond out process. Once the completed device has been attached to the device package, bond wires are added between bond pads on the integrated circuit and bond pads in the package. A reliable electrical ground between the package and the bond machine is necessary for the wire bonder to electrically test the connection between the gold bond wire and the integrated circuit or package. A very small electrical current is applied to verify the electrical connection through a very large resistance path to ground. It is critical that a good ground is maintained between the package ground and the wire bonder. If the ground fails, the wirebond monitoring system (WBMS) will sense an open circuit between the bond wire and the ground and assume that the failure is due to a poor connection between the bond wire and the bond pad when in fact the bond wire connection may be good.

Prior art mechanisms used a clamp pressed against the seal ring at the top of the DMD package to ensure an adequate ground. While the clamp established and maintained a good ground between the wire bonder and the device package, it also generated debris particles from contact between the package and the clamp. Since the contact was on the top of the package near the device, the particles generated could easily contaminate the mirror array. What is needed is a method of holding the package in place and establishing a reliable ground connection without generating debris that can enter and damage the mirror array.

SUMMARY OF THE INVENTION

Objects and advantages will be obvious, and will in part appear hereinafter and will be accomplished by the present invention which provides a method and system for holding a package in place on a wirebond machine while maintaining a reliable ground connection between the machine and the package without creating debris that can enter the package and harm the device being packaged.

One embodiment of the claimed invention provides a holder for restraining and electrically grounding a component during a wire bonding process. The holder comprising: an electrical ground, a rigid pedestal, and a conductive resilient member supported by the rigid pedestal and electrically connected to the electrical ground. The conductive resilient member operable to engage electrical contacts on the component electrically connecting the contacts with the electrical ground.

According to another embodiment of the present invention, a wirebond machine is provided. The wirebond machine comprising: an electrical ground, a source of bond wire, a capillary tube holding a portion of the bond wire, an arm attached to the capillary tube for pressing the wire held in the tube against bond pads on a device and package, and a rigid pedestal for supporting the device and package. The rigid pedestal comprises a conductive resilient member electrically connected to the electrical ground operable to engage electrical contacts on the package and electrically connect the contacts to the electrical ground.

According to yet another embodiment of the present invention, a method of attaching bond wires to a semiconductor device and package is provided. The method comprises the steps of: providing an electrically ground, providing a rigid pedestal having a vacuum cavity and at least one conductive resilient member on a surface of the rigid pedestal, placing a component on the surface, the component comprised of a package and an electrical device inside the package, holding the component against the surface using a vacuum applied to the vacuum cavity to form a ground connect between the component and the conductive resilient member, attaching a bond wire to a bond pad on the package and a bond pad on the electrical device inside the package.

The disclosed invention provides the technical advantage of providing a reliable ground while avoiding the introduction of debris that can harm debris-intolerant devices. The reliable ground is necessary to avoid false errors from the bond wire test process. The disclosed pedestal can be used with a variety of packages reducing tool set-up time and operation intervention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A new holding mechanism has been developed that establishes a firm attachment between a package being bonded and the wirebond machine. The mechanism relies on a conductive resilient material to make electrical contact with ground stations on the package. The resilient material is ideally coupled with a rigid pedestal to hold the resilient material and prevent excessive deformation of the resilient material or movement of the package being bonded. A vacuum cavity and port is typically provided in the pedestal to allow a vacuum to hold the device against the resilient material and pedestal.

Figure 9:
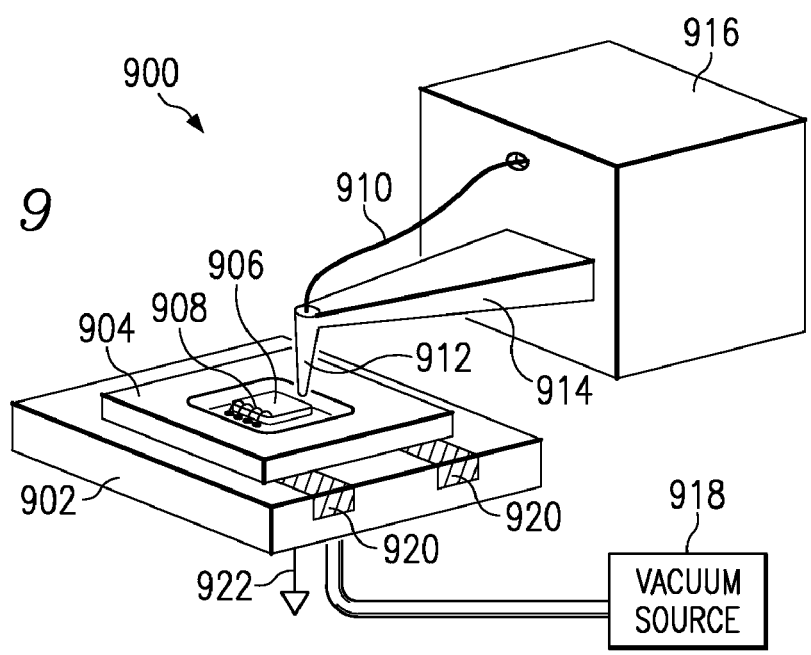
FIG. 9 is a schematic view of a wirebonding machine using the disclosed bonding pedestal to hold a package during the bonding process.

FIG. 9 is a schematic view of a wire bonder 900 using the pedestal 902 provided by the present invention. A package 904 placed on the pedestal 902 contains an electrical device 906. The bond pads on the electrical device 906 are electrically connected to bond pads on the package 904 by a series of bond wires 908. Each bond wire 908 is attached to the bond pads through a process well known in the semiconductor industry. A length of bond wire 910 is provided and extended through a capillary tube 912. A spark melts the end of the bond wire to form a ball. The capillary tube presses the ball against a bond pad on the device 906. The capillary tube 912 vibrates so that the combination of pressure and vibration cause the ball of the bond wire to form an intermetallic bond with the bond pad of the device 906. Heat is often applied to facilitate this bond.

After forming the ball bond, the capillary tube pays out bond wire as the arm 914 of the bonding machine 916 moves the capillary tube and bond wire to a bond pad of the package 904. The bond wire is pressed against the package bond pad and vibrated—creating a bond between the wire and a bond pad on the package 904. The wire is then sheared off and the process repeated for each connection between the device 906 and package 904.

During the bonding process, the wire bonder applies an electrical current to the wire to test for continuity between the wire and bond pad. Each bond pad has a high impedance path to one or more package ground pads on the bottom of the package. It is necessary that these package ground pads have a reliable ground connection to complete the test circuit. If the package is not grounded the wire bonder will detect an open circuit between the wire and the ground connection and assume that the bond between the bond wire and the bond pad is bad.

As described above, prior art wirebond machines used an overhead clamp to press on the top surface of the package. Pressing on the top of the package provided good contact between the pads on the bottom of the package and the pedestal supporting the package. The overhead clamp, however, generated a lot of debris that could damage the DMD.

Figure 1:
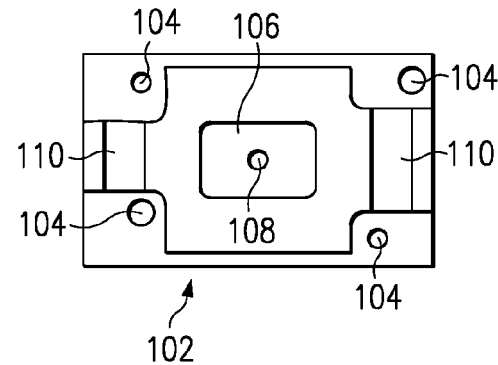
FIG. 1 is a plan view of a rigid pedestal according to one embodiment of the present invention.

FIG. 1 is a plan view of a rigid pedestal 102 according to one embodiment of the present invention that provides a reliable ground connection to the package ground pads. The pedestal provides holes 104 to mount and align the pedestal to the rest of the wire bond machine. A central vacuum cavity 106 in communication with a vacuum port allows a vacuum source 918, shown in FIG. 9, to create a low pressure region underneath the package to hold the package against the rigid pedestal 102. The rigid pedestal 102 typically is 300-series stainless steel, but could be a ceramic, or some other material. The rigid pedestal 102 includes two slot regions 110 designed to receive a conductive resilient material.

Figure 2:
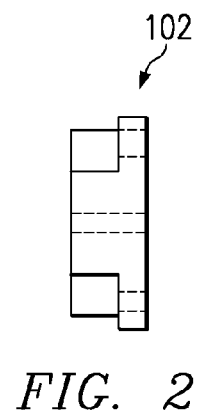
FIG. 2 is a side view of the rigid pedestal of FIG. 1.
Figure 3:
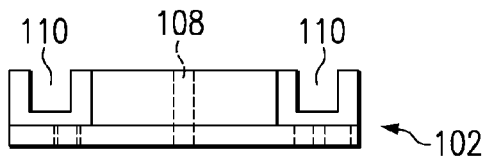
FIG. 3 is a front view of the rigid pedestal of FIG. 1.
Figure 4:
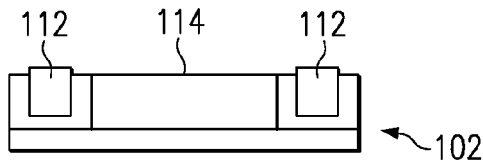
FIG. 4 is a front view of the rigid pedestal of FIG. 1 showing the addition of conductive resilient strips to engage and hold a device package.

FIG. 2 is a side view, and FIG. 3 a front view, of the rigid pedestal of FIG. 1. FIG. 4 is a front view of the rigid pedestal of FIG. 1 showing the addition of conductive resilient strips 112 installed in the slot regions shown in FIGS. 1 and 3. The conductive resilient strips engage the ground pads on the package being bonded and provide a reliable connection between the ground pads and a ground connection provided by the bonding machine, typically through the rigid pedestal when a conductive pedestal is used.

The resilient strips 112 are elastic enough to conform to the device as the vacuum holds the device against the pedestal—thus ensuring a good ground—yet firm enough to prevent excessive movement by the package being bonded. If the package is allowed to move during the high-frequency vibration forming the bond, the size and shape of the ball of bond wire would not be consistent and the bond formed would not be as reliable since some of the scrubbing energy used to form the bond would be dissipated.

The resilient strips 112 typically are an elastomer with a durameter value low enough to allow the elastomer to conform to the package. The material must be durable enough to maintain its shape an resiliency over long periods of time during which many devices are processed. Silicon elastomers promise to provide the required resiliency and durability. The elastomer can be made to conduct by impregnating the elastomer with a conductor, typically a metal such as silver (Ag) or copper (Cu). Although DMDs are typically bonded at room temperature, many semiconductor devices are bonded at an elevated temperature. If bonding is performed at an elevated temperature to improve the integrity of the bond, an elastomer must be selected that is capable of enduring the selected temperature without deterioration or loss of resiliency.

The resilient strips 112 extend above the face 114 of the rigid pedestal 102 by approximately 1 mil. Extension beyond the face of the rigid pedestal ensures the resilient strips make good contact with the package pads. Too much extension would allow movement of the package as described above, and could also lead to an unreliable package height. It is important that the bond pads be elevated to a point so that the capillary tube of the bonder is perpendicular to the package during the bonding process. The size, shape, and location of the resilient strips is chosen to allow the resilient strips to contact the ground pads on the bottom of the package. The area covered by the resilient strips 112 is limited to restrict motion of the package during the bonding process.

Figure 5:
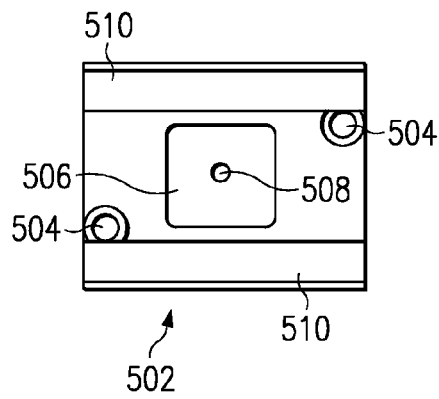
FIG. 5 is a plan view of a rigid pedestal according to one embodiment of the present invention.
Figure 6:
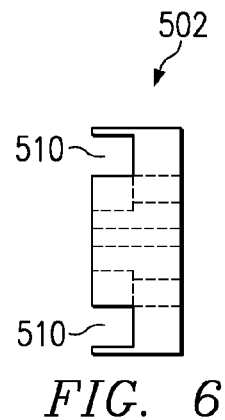
FIG. 6 is a side view of the rigid pedestal of FIG. 5.
Figure 7:
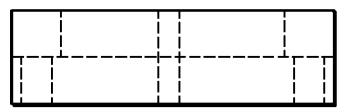
FIG. 7 is a front view of the rigid pedestal of FIG. 5.

FIG. 5 is a plan view of a rigid pedestal 502 according to a second embodiment of the present invention. FIG. 6 is a side view, and FIG. 7 is a front view, of the rigid pedestal 502 of FIG. 5. Like the prior example, the rigid pedestal 502 of FIG. 5 includes holes 504 for aligning and attaching the pedestal to the wire bonder. The pedestal also includes a vacuum cavity 506 and vacuum port 508 as well as slots 510 designed to receive resilient strips 512, shown installed in FIG. 8.

Figure 8:
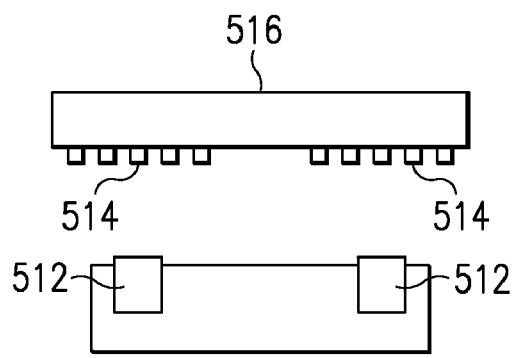
FIG. 8 is a side view of the rigid pedestal of FIG. 5 showing the addition of conductive resilient strips to engage and hold a device package.

FIG. 8 shows the relationship between the resilient strips and the contact pads 514 formed on the bottom of the package 516. As shown in FIG. 8, the resilient strips 512 are designed to contact some, but not all of the contacts 514. Which contact pads must be contacted by the resilient strip is determined by the design of the device and package. The only requirement is to establish a reliable ground for the bond pads. Depending on how the contact pads are connected together, contact between only a few of the pads 514—which are not shown to scale in FIG. 8—and the resilient strips is sufficient to reliably ground the package. Excessive contact between the resilient strips and the pads on the package leads to motion of the package during the bondout process and should be avoided.

FIG. 9 shows the improved wirebond pedestal 902 in use. A package 904 is held against the pedestal 902 by application of a vacuum source 918. The package 904 deforms the resilient strips 920 located in the rigid member of the pedestal ensuring good contact between the ground pads of the package 904 and the resilient members 920. The resilient members 920 are conductive and electrically connect the package grounds to a system ground 922. Although shown as strips in FIGS. 4, 8, and 9, the resilient members can be any shape that provide sufficient grounding to the package and prevents excessive motion during the bonding process.

Thus, although there has been disclosed to this point a particular embodiment for a wire bonder with a compliant wirebond pedestal and method therefore etc., it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A semiconductor device comprising:
   a semiconductor die;
   a package; and
   a bond wire electrically connecting said semiconductor die and said package, said bond wire attached by a wire bonder comprising:
      a mechanism for pressing a portion of a bond wire against an item to be bonded; and
      a conductive resilient member operable to electrically connect said item to an electrical potential during a bond wire attachment process.

2. The semiconductor device of claim 1, wherein said conductive resilient member is a silicone elastomer.

3. The semiconductor device of claim 1, wherein said conductive resilient member is a silicone elastomer impregnated with a metal.

4. The semiconductor device of claim 1, wherein said conductive resilient member is a Ag—Cu filled silicone elastomer.

5. The semiconductor device of claim 1, wherein said wire bonder comprises a rigid pedestal.

6. The semiconductor device of claim 1, wherein said wire bonder comprises a rigid pedestal having a vacuum cavity operable to hold said item against said rigid pedestal.

7. The semiconductor device of claim 1, wherein said wire bonder comprises a rigid pedestal and said conductive resilient member comprising a first face operable to engage electrical contacts on said package, said first face extending beyond adjacent portions of said rigid pedestal.

8. The semiconductor device of claim 1, wherein said conductive resilient member deforms as said item is pressed against said conductive resilient member.

9. The semiconductor device of claim 1, wherein said wire bonder comprises a rigid pedestal and said conductive resilient member deforms as said item is pressed against said conductive resilient member such that said item contacts portions of said rigid pedestal.

10. The semiconductor device of claim 1, wherein said item is grounded through said conductive resilient member.

11. The semiconductor device of claim 1, wherein said wire bonder comprises a rigid pedestal and said resilient member is positioned in grooves formed in said rigid pedestal.

\* \* \* \* \*